(12) United States Patent
Kim et al.

(10) Patent No.: US 10,079,271 B2
(45) Date of Patent: Sep. 18, 2018

(54) MASK ASSEMBLY, APPARATUS, AND METHOD OF MANUFACTURING DISPLAY APPARATUS

(71) Applicant: Samsung Display Co., Ltd., Yongin-si (KR)

(72) Inventors: Jaesik Kim, Yongin-si (KR); Taemin Kang, Yongin-si (KR); Jeongkuk Kim, Yongin-si (KR); Youngsuk Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/181,814

(22) Filed: Jun. 14, 2016

(65) Prior Publication Data

US 2017/0117474 A1 Apr. 27, 2017

(30) Foreign Application Priority Data

Oct. 26, 2015 (KR) .......................... 10-2015-0148821

(51) Int. Cl.
| | |
|---|---|
| *H01L 51/00* | (2006.01) |
| *H01L 27/32* | (2006.01) |
| *H01L 51/56* | (2006.01) |
| *C23C 14/04* | (2006.01) |
| *C23C 14/08* | (2006.01) |

(52) U.S. Cl.
CPC ........ *H01L 27/3244* (2013.01); *C23C 14/042* (2013.01); *H01L 51/56* (2013.01); *C23C 14/08* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 6,893,575 B2 | 5/2005 | Yotsuya | |
| 2011/0185965 A1* | 8/2011 | Park | ........................ B05C 11/00 |
| | | | 118/504 |
| 2012/0234236 A1* | 9/2012 | Ko | ........................ C23C 14/042 |
| | | | 118/504 |
| 2014/0177055 A1 | 6/2014 | Lee et al. | |
| 2015/0044930 A1* | 2/2015 | Han | .................... H01L 51/0011 |
| | | | 445/3 |
| 2015/0079503 A1* | 3/2015 | Xie | .......................... G03F 1/00 |
| | | | 430/5 |

(Continued)

FOREIGN PATENT DOCUMENTS

| | | |
|---|---|---|
| JP | 2007-152613 | 6/2007 |
| KR | 10-2003-0025815 | 3/2003 |

(Continued)

*Primary Examiner* — Abul Kalam
(74) *Attorney, Agent, or Firm* — H.C. Park & Associates, PLC (57) ABSTRACT

Provided are a mask assembly, an apparatus for manufacturing a display apparatus, and method of manufacturing a display apparatus. The mask assembly includes a mask frame and a mask sheet arranged on the mask frame. The mask sheet includes a pattern portion configured to allow a deposition material to pass through an opening of the pattern portion. The pattern portion is recessed from a surface of the mask sheet. In addition, an outermost edge of the pattern portion is uneven.

4 Claims, 8 Drawing Sheets

(56) References Cited

U.S. PATENT DOCUMENTS

| | | | | |
|---|---|---|---|---|
| 2015/0104608 A1* | 4/2015 | Lee | ................... | C23C 14/042 |
| | | | | 428/131 |
| 2015/0228927 A1* | 8/2015 | Kim | ................... | H01L 51/5203 |
| | | | | 257/40 |
| 2015/0379924 A1* | 12/2015 | Matsueda | ............ | G09G 3/3208 |
| | | | | 345/690 |
| 2016/0104850 A1* | 4/2016 | Joo | ................... | H01L 27/3244 |
| | | | | 257/82 |
| 2017/0069843 A1* | 3/2017 | Kang | ................. | H01L 51/0011 |

FOREIGN PATENT DOCUMENTS

| | | |
|---|---|---|
| KR | 10-2005-0083421 | 8/2005 |
| KR | 10-2015-0044082 | 4/2015 |

\* cited by examiner

MASK ASSEMBLY, APPARATUS, AND METHOD OF MANUFACTURING DISPLAY APPARATUS

CROSS-REFERENCE TO RELATED APPLICATION

This application claims priority from and the benefit of Korean Patent Application No. 10-2015-0148821, filed on Oct. 26, 2015, which is hereby incorporated by reference for all purposes as if fully set forth herein.

BACKGROUND

Field

Exemplary embodiments relate to a mask assembly, an apparatus for manufacturing a display apparatus, and method of manufacturing a display apparatus.

Discussion of the Background

Portable electronic devices are widely used. Recently, consumers widely use tablets along with small electronic devices such as mobile phones.

A portable electronic device may include a display apparatus in order to support various functions or provide a user with visual information such as an image. As components for driving display apparatuses have recently decreased in size, the importance of the display apparatuses in electronic devices tends to increase.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide mask sheets that are manufactured through general methods may be fixed to mask frames by welding, etc. while tensile force is applied to the mask sheets. In this case, pattern portions of the mask sheets may be deformed or curved, and thus, it may be difficult to accurately deposit deposition materials on the mask sheets. One or more exemplary embodiments include a mask assembly capable of depositing deposition materials in an accurate pattern, an apparatus and method of manufacturing a display apparatus.

Additional aspects will be set forth in the detailed description which follows, and, in part, will be apparent from the disclosure, or may be learned by practice of the inventive concept.

An exemplary embodiment includes a mask assembly that includes a mask frame and a mask sheet arranged on the mask frame. The mask sheet includes a pattern portion configured to allow a deposition material to pass through an opening of the pattern portion. The pattern portion is recessed from a surface of the mask sheet, and an outermost edge of the pattern portion is uneven.

An exemplary embodiment also includes an apparatus for manufacturing a display apparatus. The apparatus for manufacturing the display apparatus includes a mask assembly and a deposition source facing the mask assembly. The mask assembly includes a mask frame and a mask sheet arranged on the mask frame. The mask sheet includes a pattern portion configured to allow a deposition material to pass through an opening of the pattern portion, the pattern portion is recessed from a surface of the mask sheet, and an outermost edge of the pattern portion is uneven.

An exemplary embodiment also includes a method of manufacturing a display apparatus. The method includes arranging a deposition source, a mask assembly, and a substrate such that the deposition source faces the mask assembly and the mask assembly faces the substrate, and depositing a deposition material on the substrate by at least one of evaporating the deposition material from the deposition source and passing the deposition material through the mask assembly, and sublimating the deposition material form the deposition source and passing the deposition material through the mask assembly. The mask assembly includes a mask frame and a mask sheet arranged on the mask frame which includes a pattern portion configured to allow a deposition material to pass through an opening of the pattern portion. The pattern portion is recessed from a surface of the mask sheet and has an outermost portion that is uneven.

These general and specific embodiments may be implemented by using a system, a method, a computer program, or a combination thereof.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
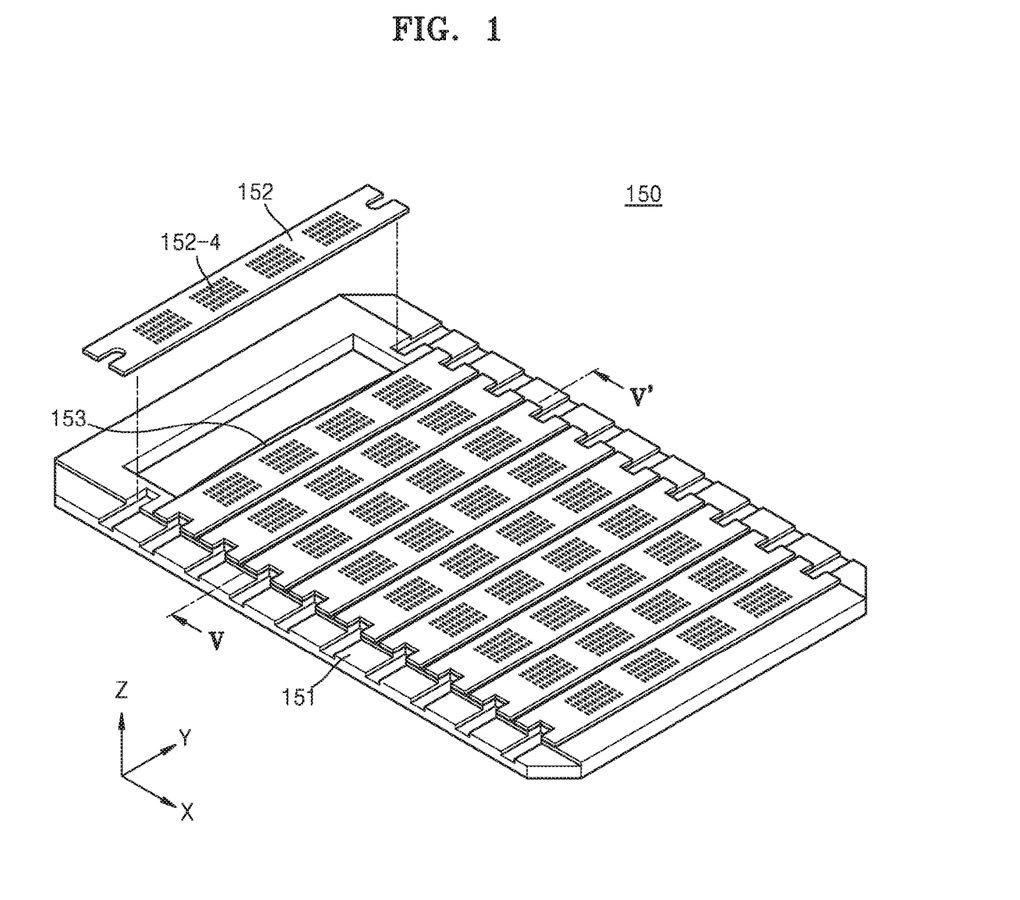
FIG. 1 is a perspective view of a mask assembly according to an exemplary embodiment.
Figure 2:
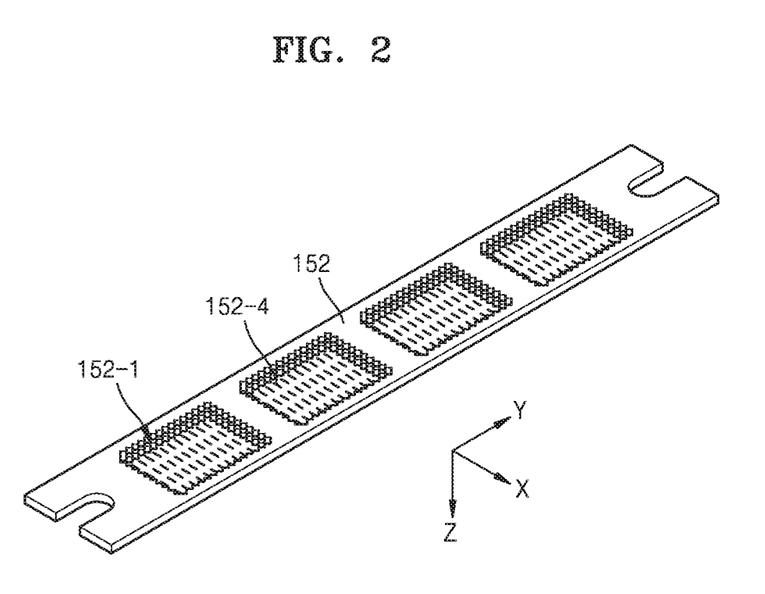
FIG. 2 is a perspective view of a mask sheet of FIG. 1.
Figure 3:
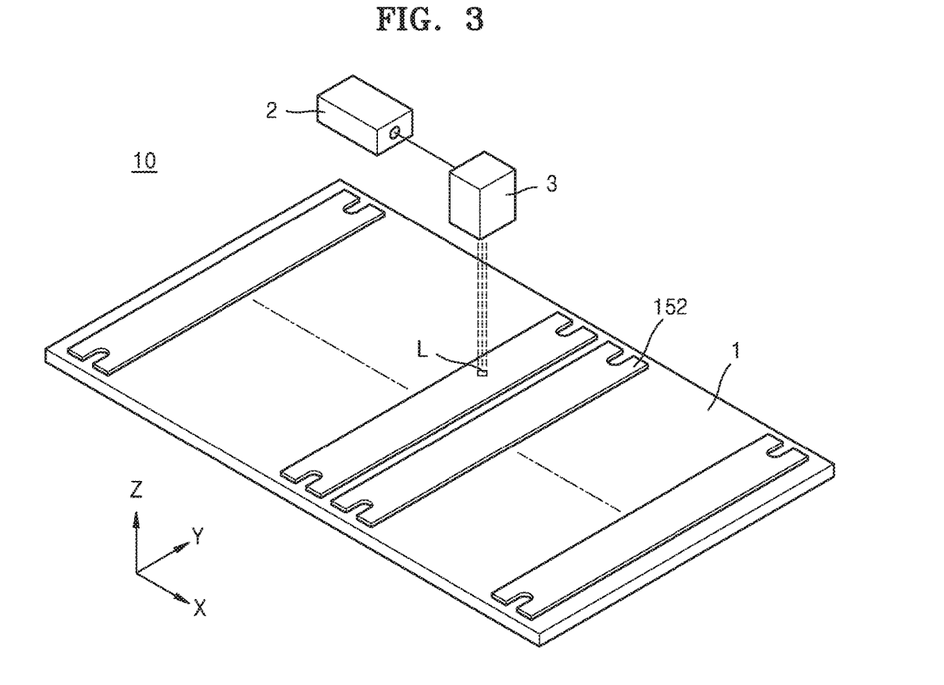
FIG. 3 is a conceptual view of an apparatus for manufacturing a mask sheet of FIG. 1.
Figure 4:
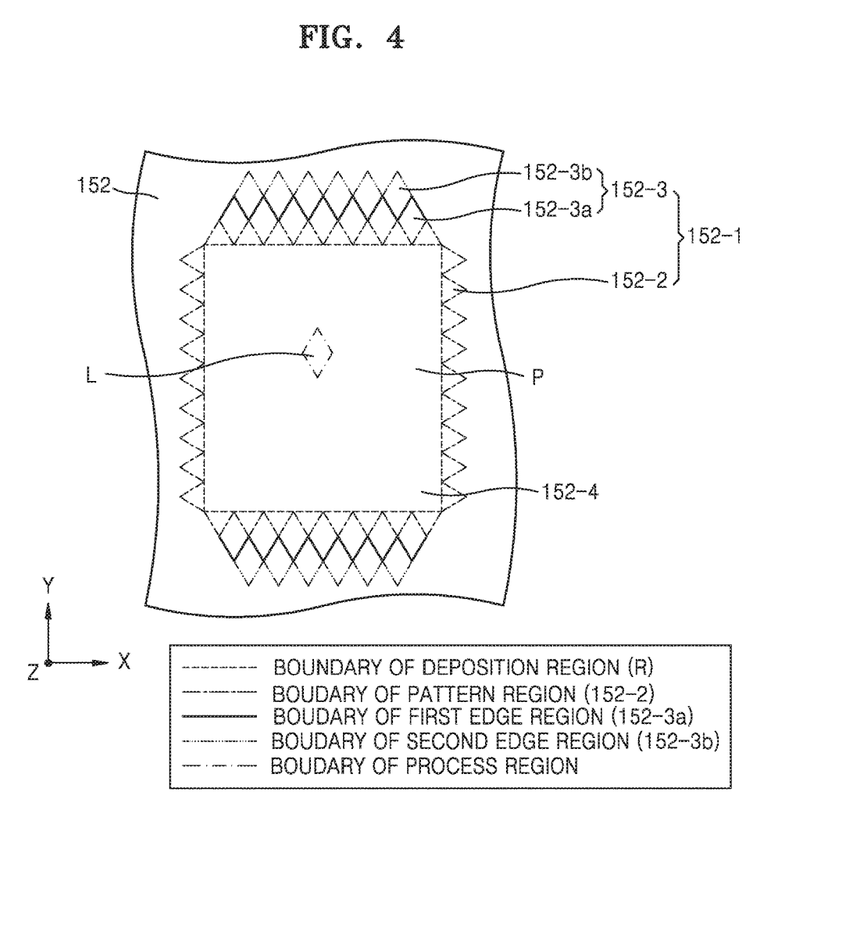
FIG. 4 is a plan view of a portion of the mask sheet of FIG. 1.
Figure 5:
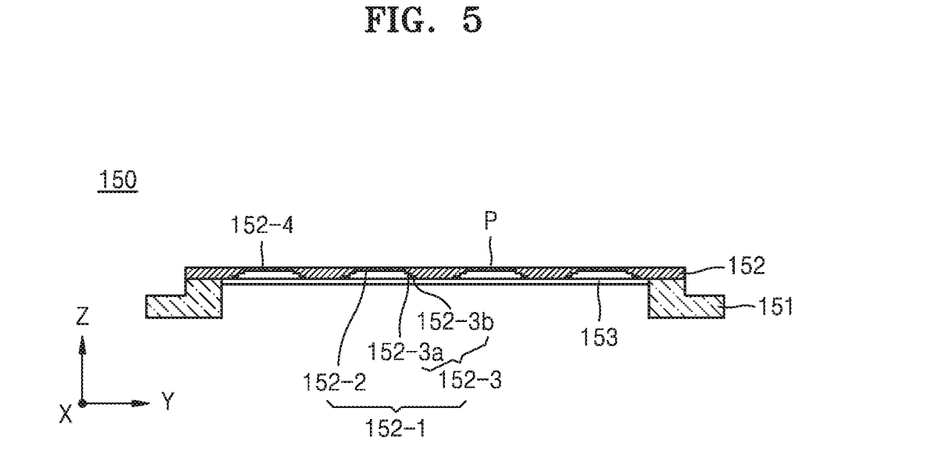
FIG. 5 is a cross-sectional view taken along a sectional line V-V' of FIG. 1.

FIG. 1 is a perspective view of a mask assembly 150 according to an exemplary embodiment. FIG. 2 is a perspective view of a mask sheet 152 of FIG. 1. FIG. 3 is a conceptual view of an apparatus for manufacturing the mask sheet 152 of FIG. 1. FIG. 4 is a plan view of a portion of the mask sheet 152 of FIG. 1. FIG. 5 is a cross-sectional view taken along a line V-V' of FIG. 1.

Referring to FIGS. 1, 2, 3, 4, and 5, the mask assembly 150 may include a mask frame 151, mask sheets 152, and a reinforcement member 153. In this case, the mask frame 151 may include frames (not shown). The mask frame 151 may include a plate. In this case, a central portion of the mask frame 151 may be open.

The mask sheet 152 may have a plate form or a stick form. In this case, when the mask sheet 152 has the plate form, the mask sheet 152 may be installed on the mask frame 151 to cover the entire mask frame 151. In an exemplary embodiment, when the mask sheet 152 has a stick form, multiple mask sheets 152 are installed adjacent to one another on the mask frame 151. Hereinafter, for convenience and by no means limiting, a case where there are multiple mask sheets 152 will be described below.

The mask sheet 152 may be installed on the mask frame 151 to cross a central portion of the mask frame 151. In this case, the mask sheet 152 may be installed on the mask frame 151 while tensile force is being applied to the mask sheet 152.

The mask sheets 152 may be installed on the mask frame 151 such that they extend along a Y-axis direction of FIG. 1 of the mask frame 151. The mask sheets 152 may be installed on the mask frame 151 such that the mask sheets 152 are arranged in an X-axis direction of the mask frame 151 substantially parallel to the Y-axis such that the mask sheets 152 are adjacent to each other. In this case, the mask sheets 152 may be installed on the mask frame 151 to cover the entire open portion of the mask frame 151.

The mask sheet 152 may include pattern portions 152-1 in which open portions 152-4 are formed. In this case, the open portions 152-4 may form uniform patterns. In detail, the open portions 152-4 may be formed in the pattern portions 152-1 at certain intervals.

Outermost edges of the pattern portions 152-1 may be uneven. For example, the outermost edges of the pattern portions 152-1 may have a corrugated shape similar to the teeth on a saw.

The pattern portions 152-1 may have a thickness different from that of another portion of the mask sheet 152 (e.g., a portion of the mask sheet 152 where the pattern portions 152-1 are not formed). For example, the pattern portions 152-1 may have a smaller thickness than that of another portion of the mask sheet 152. In other words, the pattern portions 152-1 may be recessed from a surface of the mask sheet 152.

As shown in FIGS. 4 and 5, the pattern portion 152-1 may include a pattern region 152-2 where the open portions 152-4 are formed. In an exemplary embodiment, the pattern portions 152-1 include the pattern regions 152-2 and edge regions 152-3 connected to the pattern regions 152-2 and covering the same. In this case, the pattern region 152-2 may include a deposition region P where a deposition material may be deposited on a substrate (not shown). Hereinafter, for convenience, the pattern portion 152-1 includes the pattern regions 152-2 and the edge regions 152-3.

The pattern region 152-2 and the edge regions 152-3 may be connected to each other. In this case, outermost portions of the pattern regions 152-2 and the edge regions 152-3 may be uneven. In detail, the outermost portions of the pattern regions 152-2 and the edge regions 152-3 may have a corrugated shape similar to the teeth on a saw. In this case, at least some of the outermost portions of the edge regions 152-3 may be pointed in a lengthwise direction (i.e., the Y-axis direction) of the mask sheet 152.

The pattern region 152-2 may have the same thickness as the edge region 152-3. When the pattern region 152-2 has the same thickness as the edge region 152-3, the thicknesses of the edge regions 152-3 may be identical. In an exemplary embodiment, at least some of the edge regions 152-3 have the same thickness as the pattern region 152-2, and others of the edge regions 152-3 have different thicknesses from the pattern region 152-2. In this case, the thickness of the edge regions 152-3 may vary in a longitudinal direction (i.e., Y-axis direction) of the mask sheet 152. The thickness of the edge regions 152-3 may also vary in a direction other than the longitudinal direction of the mask sheet 152. For example, the thickness of the edge regions 152-3 may vary in a direction diagonal to the longitudinal direction of the mask sheet 152 (i.e., a direction oblique to the Y-axis). Moreover, portions of the edge regions 152-3 closer to the pattern region 152-2 may be thinner than portions of the edge regions 152-3 that are further away from the pattern region 152-2. In other words, the edge regions 152-3 have a thickness that increases in a gradual or stepwise manner as the edge region 152-3 extends further from the pattern region 152-2.

In an exemplary embodiment, the thickness of the pattern region 152-2 is different from that of the edge region 152-3. In this case, the pattern region 152-2 and the edge region 152-3 may have different thicknesses. For example, the thickness of the pattern region 152-2 may be uniform and less than that of the edge region 152-3 which is uniform. As another example, the thicknesses of the edge regions 152-3 may non-uniform (e.g., multi-stepped) and may increase in thickness away from the pattern region 152-2. Therefore, outer regions of the pattern portions 152-1 (e.g., the edge regions 152-3) may have step changes increases in thickness away from the inner regions (e.g., the pattern region 152-2).

Hereinafter, for convenience but by no means limiting, edge regions 152-3 are stepped from the pattern regions 152-2, and the edge regions 152-3 themselves are stepped.

The edge region 152-3 may include a first edge region 152-3a having a greater thickness than the pattern region 152-2 and a second edge region 152-3b having a greater thickness than the first edge region 152-3a. In this case, the first edge region 152-3a and the second edge region 152-3b may be sequentially connected to the pattern region 152-2. Also, the first edge region 152-3a may surround an outer portion of the pattern region 152-2, and the second edge region 152-3b may surround an outer portion of the first edge region 152-3a. In particular, the first edge region 152-3a may be formed between the outermost portions of the pattern regions 152-2 having a corrugated shape. Put another way, the edge of the pattern region 152-2 has a corrugated shape that is similar to the teeth of a saw.

As shown in FIGS. 1 and 5, the reinforcement member 153 may be installed on the mask frame 151 and may prevent the mask frame 151 from being deformed. In this case, the reinforcement member 153 may cross the mask frame 151 such that only some mask sheets 152 are reinforced. Alternatively, the reinforcement member 153 may cross the mask frame 151 such that each mask sheet 152 of the mask assembly 150 is reinforced. In particular, the reinforcement member 153 may be installed on the mask frame 151 in a frame form. In an exemplary embodiment, the reinforcement member 153 is in a grid form such as a window frame and may be installed between the mask sheet 152 and the mask frame 151.

The above mask sheet 152 may be manufactured by an apparatus 10 of FIG. 3 for manufacturing a mask sheet. In this case, the apparatus 10 for manufacturing a mask sheet may include a stage 1, a laser irradiation unit 2, and a light guide unit 3.

The stage 1 may be in a plate form such that the mask sheet 152 may be mounted on the stage 1. Also, the stage 1 may linearly move in two different directions. In this case, the stage 1 may move while the mask sheet 152 is being mounted on the stage 1.

The laser irradiation unit 2 may irradiate light as a laser beam toward a light guide unit 3. The light guide unit 3 may receive the laser beam light from the laser irradiation unit 2, and may form multiple laser beams by diverging the received light. The light guide unit 3 may refract or guide the multiple laser beams in a direction different from an initial direction (e.g., a substantially perpendicular direction as shown in FIG. 3).

In the apparatus 10 for manufacturing a mask sheet, the multiple laser beams diverged by the light guide unit 3 from the single laser beam may form a predetermined region or shape. The region may correspond to a process region L on the mask sheet 152 as shown in FIGS. 3 and 4. For example, the light diverged by the light guide unit 3 may form about one hundred ninety six (196) laser beams, and the one hundred ninety six laser beams may be arranged in a fourteen by fourteen (14×14) matrix such that one process region L may be formed. In this case, the process region L may be used to form part of the pattern portion 152-1 on the mask sheet 152.

The process region L may be moved on the mask sheet 152 multiple times in order to form the pattern portions 152-1. In this case, the stage 1 may move the mask sheet 152 in such a manner that the process regions L are adjacent to each other. For example, after one process region L processes a portion of the mask sheet 152, the stage 1 moves the mask sheet 152 in one direction such that the processed portion of the mask sheet 152 may be adjacent to other process regions L. Then, the other process regions L are processed, and the pattern portions 152-1 may be formed by repeatedly performing the above procedure.

In the above case, the process regions L may be connected to each other. In this case, a shape of the process region L may be a polygon such as a rhombus. In detail, vertices of the process regions L may be arranged in the lengthwise direction (i.e., Y-axis direction) of the mask sheet 152. In this case, the edges of the pattern regions 152-2 formed by the process regions L and the edge regions 152-3 may be uneven (e.g., having a corrugated shape).

The mask sheet 152 manufactured as above may be installed on the mask frame 151 while the tensile force is being applied to the mask sheet 152. In this case, when the tensile force is applied to a mask sheet 152 without the pattern regions 152-2 and the edge regions 152-3 as described above, the pattern portions 152-1 may be deformed. In detail, when the pattern portions 152-1 are deformed, the open portions 152-4 of the pattern portions 152-1 may have a shape different from an initial shape thereof. In this case, since a deposition material may not be accurately formed on the substrate 21 in a uniform pattern, a defect ratio of a display apparatus (not shown) may increase. However, when the pattern portions 152-1 having the pattern regions 152-2 and the edge regions 152-3 are formed on the mask sheet 152, a pattern of the open portions 152-4 may not change. In detail, as the process regions L may be rhombus-shaped when the pattern regions 152-2 and the edge regions 152-3 are formed, deformation of the mask sheet 152 occurring due to the tensile force may be distributed. As edge portions of the pattern portions 152-1 are uneven, the mask sheet 152 elastically extends, and thus, gaps between the open portions 152-4 may increase at a certain ratio. Moreover, the surface of the pattern portions 152-1 may be curved due to the edge portions of the pattern portions 152-1.

Therefore, the mask assembly 150 described above may reduce the pattern change of the open portions 152-4, and thus, the deposition material may be deposited on the substrate 21 in a uniform pattern. Also, the mask assembly 150 described above may provide elasticity to the edge portions of the pattern portions 152-1 while the mask sheet 152 extends, and thus, damage of the mask sheet 152 may be prevented.

Figure 6:
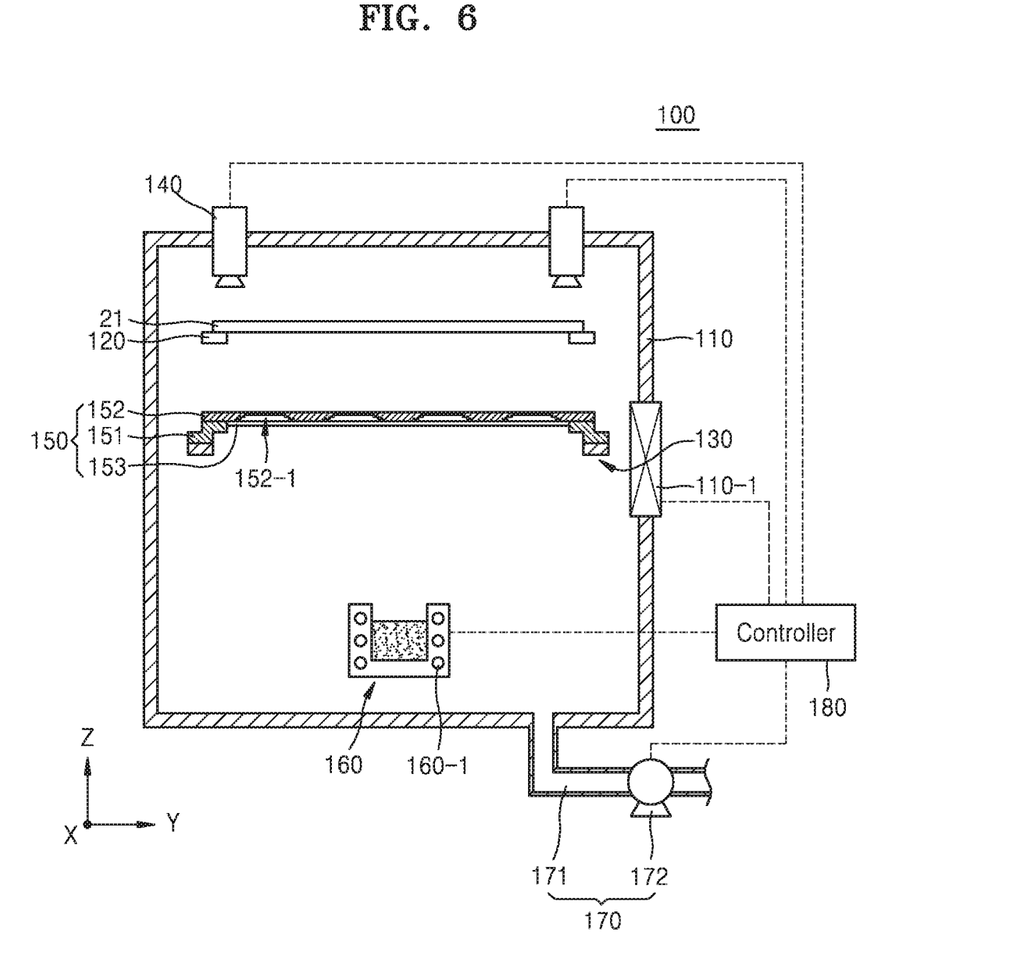
FIG. 6 is a cross-sectional view of an apparatus for manufacturing a display apparatus using the mask assembly of FIG. 1.

FIG. 6 is a cross-sectional view of an apparatus 100 for manufacturing a display apparatus using the mask assembly 150 of FIG. 1.

Referring to FIG. 6, the apparatus 100 for manufacturing a display apparatus may include the mask assembly 150, a deposition source 160, a substrate supporter 120, a mask assembly supporter 130, a suction part 170, a vision unit 140, and a chamber 110.

The mask assembly 150 may include the mask frame 151 and the mask sheet 152. In this case, the mask sheet 152 may be formed through the same or similar process described with reference to FIGS. 1, 2, 3, 4, and 5.

A deposition material may be stored in the deposition source 160. In this case, the deposition material may be sublimated or evaporated and may include at least one of an inorganic material and an organic material. For example, the deposition material may include a metal and an organic material. Hereinafter, for convenience, the deposition material is an organic material.

The deposition source 160 may face the mask frame 151. A portion of the deposition source 160 which faces the mask frame 151 may be open. The deposition source 160 may also include a heater 160-1 for applying heat to the deposition material.

The substrate supporter 120 may support the substrate 21. In this case, the substrate supporter 120 may have various shapes. For example, the substrate supporter 120 may include a shuttle, an electrostatic chuck, a physical sticky chuck, or the like arranged within the chamber 110. In an exemplary embodiment, the substrate supporter 120 includes an additional support frame arranged within the chamber 110. Hereinafter, for convenience, the substrate supporter 120 includes an additional support frame.

The deposition material may be deposited on regions of the substrate 21 that are spaced apart from each other. In this case, the pattern portions 152-1 may be spaced apart from each other on the mask sheet 152. In detail, after the deposition is completed, the substrate 21 may be divided into multiple portions, and thus, display apparatuses (not shown) may be formed. In an exemplary embodiment, the deposition material is deposited on the entire substrate 21. In this case, the pattern portions 152-1 may be formed on the entire mask sheet 152. In particular, after the deposition is completed, the substrate 21 may be used to form one display apparatus (not shown). Hereinafter, for convenience and by no means limiting, the deposition material may be deposited on the regions of the substrate 21 which are spaced apart from each other.

The mask assembly supporter 130 may be arranged between the substrate supporter 120 and the deposition source 160. In this case, the mask assembly supporter 130 may be installed on the mask assembly 150 and may support the same. In this case, a position of the mask assembly 150 may be adjusted within a small range such that the mask assembly 150 and the substrate 21 may be aligned.

The suction part 170 may be connected to the chamber 100 and may uniformly maintain an internal pressure of the chamber 110. In this case, the suction part 170 may include a connection pipe 171 connected to the chamber 110 and a pump 172 installed in the connection pump 171. The pump 172 may be used to pressurize the chamber 110, maintain atmospheric pressure in the chamber 110, or create a vacuum in the chamber 110 depending on a particular process step.

The vision unit 140 may include a camera. In this case, the vision unit 140 captures locations of the substrate 21 and the mask assembly 150 and may provide data to a controller 180 of the apparatus 100 necessary to arrange the substrate 21 and the mask assembly 150.

The chamber 110 may have internal space and a valve 110-1 installed on the enclosure of the chamber 110. The controller 180 may open the valve 110-1 to open the internal space the chamber 110 or close the valve 110-1 to close the internal space of the chamber 110. The valve 110-1 may be a gate valve or any other suitable mechanism for opening or closing the chamber such as a sealable door.

With regard to the operation of the apparatus 100 for manufacturing a display apparatus, the controller 180 may open the valve 110-1 first. In this case, the controller 180 of the apparatus 100 controls the suction part 170 to maintain atmospheric pressure or near atmospheric pressure inside the chamber 110.

When the valve 110-1 is open, the substrate 21 and the mask assembly 150 may be inserted from the outside of the chamber 110 to the inside of the chamber 110. In this case, a robotic arm, a shuttle, or other transport mechanism may insert the substrate 21 and the mask assembly 150 into the chamber 110 through the open valve 110-1. The robotic arm, shuttle, or other transport mechanism may be manually moved, separately controlled, or may controlled by the controller 180.

When the substrate 21 and the mask assembly 150 are transported inside of the chamber 110, the controller 180 may close the valve 110-1. The controller 180 may then control the suction part 170 to adjust the internal pressure of the chamber 110 to be in a vacuum state or near vacuum state. In addition, the controller 180 may control the heater 160-1 to heat the deposition material so that the deposition material is evaporated or sublimated in the deposition source 160. Then, the apparatus 100 deposits the evaporated or sublimated deposition material on the substrate 21 through the mask assembly 150. In this case, the apparatus 100 may pass the deposition material through the open portions 152-4 on the mask sheet 152 and may deposit the deposition material on the substrate 21 in a certain pattern.

As described above, the thickness of the pattern region 152-2 may be less than a thickness of another portion of the mask sheet 152 and the thickness of the edge region 152-3. In this case, although the apparatus 100 may apply tensile force to the mask sheet 152, the pattern of the open portions 152-4 are not deformed by the tensile force (e.g., are maintained) such that the apparatus 100 may deposit the deposition material on the substrate 21 in the uniform pattern.

Therefore, the apparatus 100 for manufacturing a display apparatus may deposit the deposition material on the substrate 21 in the uniform pattern. Also, the apparatus 100 for manufacturing a display apparatus may deposit the deposition material on the substrate 21 in the uniform pattern. Thus, the apparatus 100 may manufacture a display apparatus (see FIG. 7) with accurately deposited deposition material. Moreover, since the apparatus 100 for manufacturing a display apparatus may repeatedly deposit the deposition material on the substrate 21 in a certain pattern, a defect ratio may be reduced during the manufacture of a display apparatus.

Figure 7:
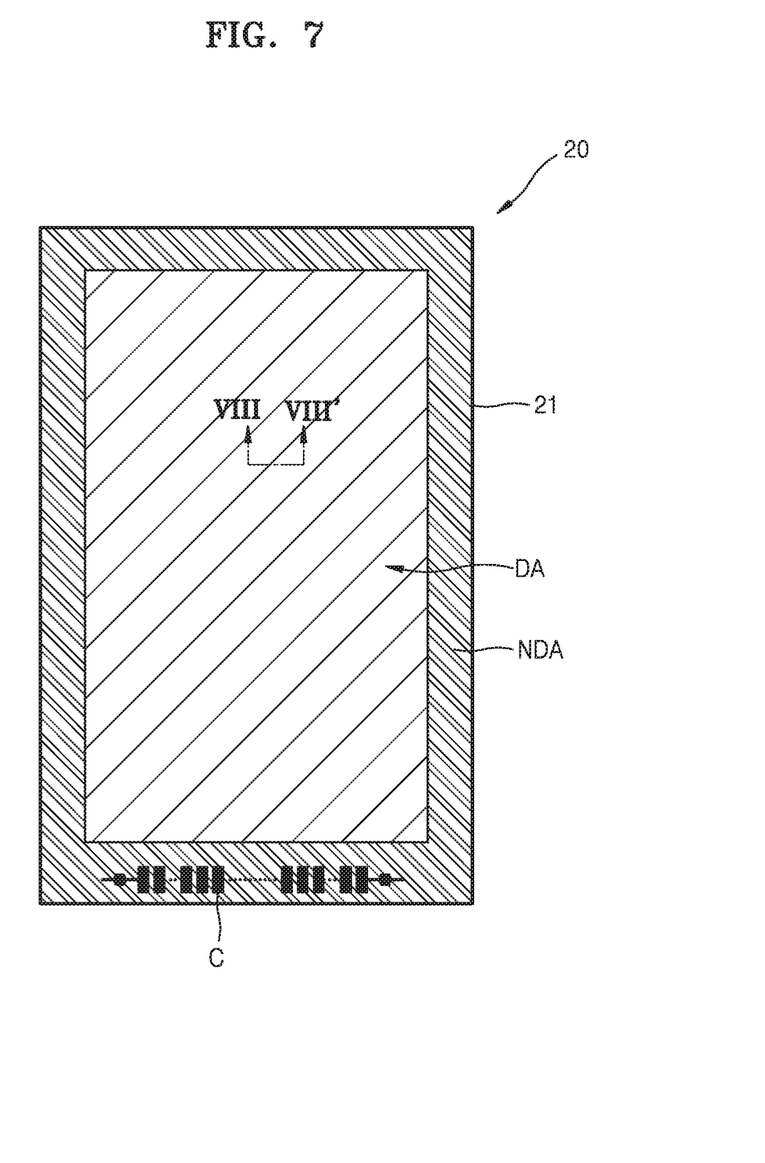
FIG. 7 is a plan view of a display apparatus manufactured by the apparatus of FIG. 6 for manufacturing a display apparatus.
Figure 8:
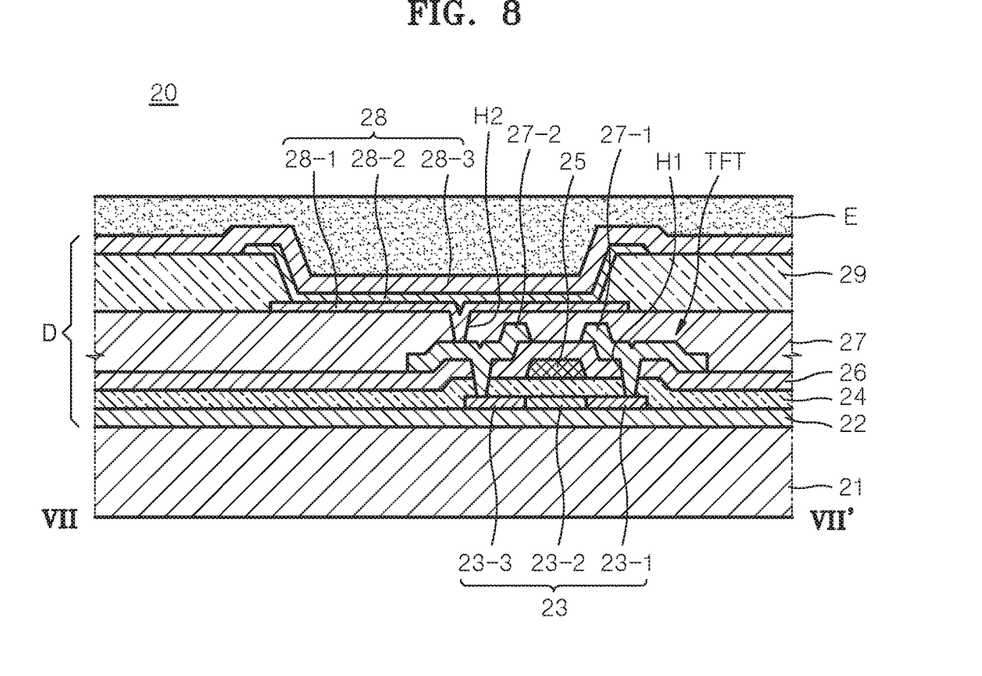
FIG. 8 is a cross-sectional view taken along a sectional line VIII-VIII' of FIG. 7.

FIG. 7 is a plan view of a display apparatus manufactured by the apparatus of FIG. 6 for manufacturing a display apparatus. FIG. 8 is a cross-sectional view taken along a line VIII-VIII' of FIG. 7.

Referring to FIGS. 7 and 8, the display apparatus 20 may define a display area DA and a non-display area NDA on an outer portion of the display area DA on the substrate 21. As shown in FIG. 8, a light-emitting area D may be arranged in the display area DA, and a power wire (not shown) and other components may be arranged in the non-display area NDA. Also, as shown in FIG. 7, a pad area C may be arranged in the non-display area NDA.

The display apparatus 20 may include the substrate 21 and the light-emitting area D. Also, the display apparatus 20 may include a thin-film encapsulation layer E disposed above the light-emitting area D. In this case, the substrate 21 may include at least one of a plastic, glass material, and a metallic material. For example, the substrate may include a metallic material such as stainless steel or titanium (Ti). As another example, the substrate 21 may include a plastic such as a polyimide (PI). Hereinafter, for convenience but by no means limiting, the substrate 21 includes PI.

The light-emitting area D may be disposed on the substrate 21. In this case, the light-emitting area D may include a thin film transistor TFT, a passivation layer 27 may be disposed to surround the thin film transistor TFT, and a light-emitting device 28 may be disposed on the passivation layer 27.

In this case, the substrate 21 may include a glass material, but a material of the substrate 21 is not limited to a glass material. As described above, the substrate 21 may include at least one of a plastic, glass, and a metallic material. Hereinafter, for convenience but by no means limiting, the substrate 21 includes a glass material.

A buffer layer 22 including an organic compound and/or an inorganic compound may be further disposed above the substrate 21 and may include at least one of a silicon oxide ($SiO_x$) and silicon nitride ($SiN_x$), where X is greater then or equal to one (i.e., $X \geq 1$).

After an active layer 23 arranged in a certain pattern is disposed on the buffer layer 22, the active layer 23 may be covered by the gate insulating layer 24. The active layer 23 may include a source area 23-1 and a drain area 23-2 with a channel area 23-2 between the source area 23-1 and the drain area 23-2.

The active layer 23 may include various materials. For example, the active layer 23 may include an inorganic semiconductor material such as amorphous silicon or crystalline silicon. As another example, the active layer 23 may include an oxide semiconductor material. As another example, the active layer 23 may include an inorganic semiconductor material. Hereinafter, for convenience but by no means limiting, the active layer 23 includes amorphous silicon.

The active layer 23 may include disposing an amorphous silicon layer on the buffer layer 22, crystallizing the amorphous silicon layer into a crystalline silicon layer, and then patterning the crystalline silicon layer. The source area 23-1 and the drain area 23-2 of the active layer 23 may be doped with impurities according to the type of thin film transistors TFT such as a driving TFT (not shown) or a switching TFT (not shown) the active layer 23 is used for.

A gate electrode 25 corresponding to the active layer 23 and an interlayer insulating layer 26 covering the gate electrode 25 may be disposed above the gate insulating layer 24.

A contact hole H1 may be formed in the interlayer insulating layer and the gate insulating layer 24. After forming the contract hole H1, a source electrode 27-1 and a drain electrode 27-2 may be disposed above the interlayer insulating layer 26 in such a manner that the source electrode 27-1 and the drain electrode 27-2 may respectively contact the source area 23-1 and the drain area 23-2.

The passivation layer 27 may be disposed over the thin film transistor TFT. A pixel electrode 28-1 of an organic light-emitting device (OLED) 28 may be disposed over the passivation layer 27. The pixel electrode 28-1 may contact the drain electrode 27-2 of the thin film transistor TFT through a via hole H2 formed in the passivation layer 27. The passivation layer 27 may include an inorganic material and/or an organic material and may be a single layer or multiple layers. The passivation layer 27 may be a planarization layer that is flat over curved layers under the passivation layer 27 or may be curved along the curve of the layers under the passivation layer 27. The passivation layer 27 may include a transparent insulator in order to achieve a resonance effect.

The pixel electrode 28-1 may be disposed on the passivation layer 27. A pixel-defining layer 29 may include an organic material and/or an inorganic material. The pixel-defining layer 29 may be disposed to cover the pixel electrode 28-1 and the passivation layer 27. The pixel-defining layer 29 may be disposed to expose the pixel electrode 28-1. In other words, the pixel defining layer 29 may not be disposed on a portion of the pixel electrode 28-1.

An intermediate layer 28-2 and an opposite electrode 28-3 are formed at least on the exposed portion of the pixel electrode 28-1. Portions of the intermediate layer 28-2 and the opposite electrode 28-3 may be disposed on portions of the pixel-defining layer 29.

The pixel electrode 28-1 may function as an anode electrode. The opposite electrode 28-3 may function as a cathode electrode. However, the polarities of the pixel electrode 28-1 and the opposite electrode 28-3 may be reversed so that the pixel electrode 28-1 may function as the cathode electrode and the opposite electrode 28-3 may function as the anode electrode.

The pixel electrode 28-1 and the opposite electrode 28-3 may be insulated from each other by an intermediate layer 28-2. An organic emission layer may emit light by applying voltages having different polarities to the intermediate layer 28-2.

The intermediate layer 28-2 may include the organic emission layer. As a an example, the intermediate layer 28-2 includes the organic emission layer and may further include at least one of a hole injection layer (HIL), a hole transport layer (HTL), an electron transport layer (ETL), and an electron injection layer (HIL). However, the disclosure is not limited to such an example. The intermediate layer 28-2 may include the organic emission layer as well as various other functional layers (not shown).

In this case, the intermediate layer 28-2 may be disposed by the apparatus 100 (not shown) for manufacturing a display apparatus.

One unit pixel may include sub-pixels. The sub-pixels may emit various colors of light. For example, the sub-pixels may respectively emit red light, green light, and blue light or may respectively emit red light, green light, blue light, and white light.

The thin-film encapsulation layer E may include inorganic layers or may include an inorganic layer and an organic layer.

The organic layer of the thin-film encapsulation layer E may include a polymer and may be a single layer or a stack layer including polyethylene terephthalate, PI, polycarbonate, epoxy, polyethylene, and polyacrylate. The organic layer may include polyacrylate. More particularly, the organic layer may include a polymerized monomer composite that includes diacrylate-based monomer and a triacrylate-based monomer. The monomer composite may further include a monoacrylate-based monomer. The monomer composite may further include a photo initiator such as diphenyl (2,4,6-trimethylbenzoyl) phosphine oxide (TPO), but the disclosure is not limited thereto.

The inorganic layer of the thin-film encapsulation layer E may be a single layer or a stack layer including a metal oxide or a metal nitride. In particular, the inorganic layer may include at least one of silicon nitride ($SiN_x$, $X \geq 1$), aluminum oxide ($Al_2O_3$), silicon dioxide ($SiO_2$) and titanium dioxide ($TiO_2$.).

An uppermost layer of the thin film encapsulation layer E may be exposed outside from the display apparatus 20. The upper most layer of the thin film encapsulation layer E may be an inorganic layer in order to prevent moisture from penetrating into the OLED.

The thin-film encapsulation layer E may have at least one structure in which at least one organic layer is positioned between at least two inorganic layers. As another example, the thin-film encapsulation layer E may include at least one structure in which at least one inorganic layer is positioned between at least two organic layers. As another example, the thin-film encapsulation layer E may include a structure, in which at least one organic layer is positioned between at least two inorganic layer and at least one inorganic layer is positioned between at least two organic layers.

The thin-film encapsulation layer E may sequentially include a first inorganic layer, a first organic layer, and a second inorganic layer from an upper portion of the OLED. As another example, the thin-film encapsulation layer E may sequentially include a first inorganic layer, a first organic layer, a second inorganic layer, a second organic layer, and a third inorganic layer from an upper portion of the OLED.

As another example, the thin-film encapsulation layer E may sequentially include a first inorganic layer, a first organic layer, a second inorganic layer, a second organic layer, a third inorganic layer, a third organic layer, and a fourth inorganic layer from an upper portion of the OLED.

A halogenated metallic layer including lithium fluoride (LiF) may be further included between the OLED and the first inorganic layer. The halogenated metallic layer may prevent damage of the OLED when the first inorganic layer is formed through a sputtering method.

The first organic layer may have a smaller area than the second inorganic layer, and the second organic layer may have a smaller area than the third inorganic layer.

The display apparatus 20 may include the intermediate layer 28-2 used to generate an accurate pattern. As the intermediate layer 28-2 is deposited on an accurate location, an image may be accurately produced. Also, although the intermediate layer 28-2 may be repeatedly deposited, the display apparatus 20 may generate a uniform pattern and thus may keep producing images having uniform quality.

According to various exemplary embodiments, it may be possible to deposit a deposition material on a substrate in a uniform pattern. Also, although a deposition process may be repeatedly performed, deformation of a mask assembly may be reduced. Since a deposition material may be deposited on an accurate location, a high-resolution display apparatus may be s manufactured.

The controller 180 and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like. In this manner, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. As such, controller 180 and/or one or more components thereof may include or otherwise be associated with one or more memories (not shown) including code (e.g., instructions) configured to cause the controller 180 and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a display apparatus, the method comprising:
    arranging a deposition source, a mask assembly, and a substrate such that the deposition source faces the mask assembly and the mask assembly faces the substrate; and
    depositing a deposition material on the substrate by at least one of evaporating the deposition material from the deposition source and passing the deposition material through the mask assembly and sublimating the deposition material from the deposition source and passing the deposition material through the mask assembly,
    wherein the mask assembly comprises:
    a mask frame; and
    a mask sheet arranged on the mask frame and comprising a pattern portion configured to allow a deposition material to pass through an opening of the pattern portion, and wherein the pattern portion is recessed from a surface of the mask sheet and has an outermost portion that comprises at least two steps, the two steps comprising a first step having a first uniform thickness and a second step having a second uniform thickness, wherein a boundary of the pattern portion is a zigzag pattern in at least one of a longitudinal direction of the mask sheet and a width direction of the mask sheet.

2. The method of claim 1, wherein the pattern portion is formed by a laser beam.

3. The method of claim 2, wherein: the pattern portion is produced by moving the mask sheet multiple times and forming each of a plurality of process regions after each time the mask sheet is moved such that the plurality of process regions are connected to each other.

4. The method of claim 3, wherein each of the plurality of process regions comprises a rhombus shape.

* * * * *